United States Patent
Olson

(10) Patent No.: US 9,438,185 B2
(45) Date of Patent: Sep. 6, 2016

(54) DEVICES AND METHODS FOR INCREASING RELIABILITY OF SCALABLE PERIPHERY AMPLIFIERS

(71) Applicant: Peregrine Semiconductor Corporation, San Diego, CA (US)

(72) Inventor: Chris Olson, Chicago, IL (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 14/081,856

(22) Filed: Nov. 15, 2013

(65) Prior Publication Data

US 2015/0137889 A1    May 21, 2015

(51) Int. Cl.
| | |
|---|---|
| H03F 1/14 | (2006.01) |
| H03F 3/21 | (2006.01) |
| H03F 1/22 | (2006.01) |
| H03F 1/52 | (2006.01) |
| H03F 3/193 | (2006.01) |
| H03F 3/24 | (2006.01) |
| H03F 3/72 | (2006.01) |

(52) U.S. Cl.
CPC ............... *H03F 3/211* (2013.01); *H03F 1/223* (2013.01); *H03F 1/526* (2013.01); *H03F 3/193* (2013.01); *H03F 3/245* (2013.01); *H03F 3/72* (2013.01); *H03F 2200/423* (2013.01); *H03F 2200/451* (2013.01); *H03F 2203/21139* (2013.01); *H03F 2203/21142* (2013.01); *H03F 2203/7206* (2013.01); *H03F 2203/7236* (2013.01)

(58) Field of Classification Search
CPC ........ H03F 3/189; H03F 1/0277; H03F 3/68; H03F 1/3211; H03F 2200/451; H03F 2200/516; H03F 3/16; H03F 1/223; H03F 3/265; H03F 1/56; H03F 3/19; H03F 2200/423; H03F 2203/21139; H03F 2203/21142; H03F 3/211; H03F 1/526; H03F 3/193; H03F 3/245; H03F 3/72
USPC ........................ 330/51, 124 R, 295, 310, 311
See application file for complete search history.

(56) References Cited

U.S. PATENT DOCUMENTS

| | | | | |
|---|---|---|---|---|
| 6,137,355 | A * | 10/2000 | Sevic et al. ..................... | 330/51 |
| 6,137,367 | A | 10/2000 | Ezzedine et al. | |
| 6,255,906 | B1 * | 7/2001 | Eidson et al. ............ | 330/124 R |
| 6,377,117 | B2 * | 4/2002 | Oskowsky et al. ............ | 330/51 |
| 6,586,996 | B2 | 7/2003 | Fanous et al. | |
| 7,088,971 | B2 | 8/2006 | Burgener et al. | |
| 7,170,341 | B2 | 1/2007 | Conrad et al. | |

(Continued)

FOREIGN PATENT DOCUMENTS

WO    2009108391    9/2009

OTHER PUBLICATIONS

Nguyen, Khanh V., Office Action received from the USPTO dated Apr. 10, 2015 for U.S. Appl. No. 14/082,004, 15 pgs.

(Continued)

*Primary Examiner* — Khanh V Nguyen
(74) *Attorney, Agent, or Firm* — Jaquez Land Greenhaus LLP; Martin J. Jaquez, Esq.; Alessandro Steinfl, Esq.

(57) ABSTRACT

Devices and methods for improving reliability of sealable periphery amplifiers is described. Amplifier segments of the sealable periphery architecture can be rotated to distribute wear. Further, extra amplifier segments can be implemented on amplifier dies to extend the overall lifetime of amplifiers.

17 Claims, 7 Drawing Sheets

(56) References Cited

U.S. PATENT DOCUMENTS

| | | | |
|---|---|---|---|
| 7,248,120 | B2 | 7/2007 | Burgener et al. |
| 7,313,416 | B1 | 12/2007 | Harmon et al. |
| 7,332,969 | B2 | 2/2008 | Woong et al. |
| 8,131,251 | B2 | 3/2012 | Burgener et al. |
| 8,138,829 | B2* | 3/2012 | Reddy et al. .................. 330/51 |
| 8,150,343 | B2 | 4/2012 | Ramachandra |
| 8,188,788 | B2* | 5/2012 | Lee ............................... 330/51 |
| 8,350,625 | B2 | 1/2013 | Komijani et al. |
| 8,502,598 | B2 | 8/2013 | Seddighrad et al. |
| 8,559,907 | B2 | 10/2013 | Burgener et al. |
| 8,649,754 | B2 | 2/2014 | Burgener et al. |
| 9,007,125 | B2 | 4/2015 | Correa et al. |
| 9,093,731 | B2 | 7/2015 | Correa et al. |
| 9,160,292 | B2 | 10/2015 | Olson et al. |
| 9,184,702 | B2 | 11/2015 | Kovac et al. |
| 2005/0030094 | A1 | 2/2005 | Conrad et al. |
| 2010/0240332 | A1 | 9/2010 | Nagayama |
| 2013/0082772 | A1 | 4/2013 | Seddighrad |
| 2014/0177755 | A1 | 6/2014 | Lu et al. |
| 2014/0266433 | A1 | 9/2014 | Nobbe et al. |
| 2014/0266460 | A1 | 9/2014 | Nobbe et al. |
| 2015/0028953 | A1 | 1/2015 | Kovac |
| 2015/0042406 | A1 | 2/2015 | Kovac et al. |
| 2015/0091656 | A1 | 4/2015 | Gaynor |
| 2015/0091657 | A1 | 4/2015 | Gaynor |
| 2015/0137845 | A1 | 5/2015 | Olson |
| 2015/0137890 | A1 | 5/2015 | Nobbe |

OTHER PUBLICATIONS

Ezzeddine, et al., "The High Voltage/High Power FET (HiVP1)", 2003 IEEE Radio Frequency Integrated Circuits Symposium, pp. 215-218.

Nobbe, Dan, Response filed in the USPTO dated Jul. 7, 2015 for U.S. Appl. No. 14/082,004, 12 pgs.

Nguyen, Khanh V., Final Office Action received from the USPTO dated Oct. 8, 2015 for U.S. Appl. No. 14/082,004, 9 pgs.

Nobbe, Dan, Response to Final Office Action dated Nov. 30, 2015 for U.S. Appl. No. 14/082,004, 9 pgs.

Curtis, Sean, Office Action received from the USPTO dated Dec. 17, 2015 for U.S. Appl. No. 14/081,678, 44 pgs.

Curtis, Sean, Notice of Allowance received from the USPTO dated Mar. 9, 2016 for U.S. Appl. No. 14/081,678, 17 pgs.

Nguyen, Khanh, Notice of Allowance received from the USPTO dated Jan. 11, 2016 for U.S. Appl. No. 14/082,004, 7 pgs.

Olson, Chris, Response filed in the USPTO dated Jan. 12, 2016 for U.S. Appl. No. 14/081,678, 11 pgs.

Nguyen, Khanh V., Notice of Allowance received from the USPTO dated Mar. 22, 2016 for U.S. Appl. No. 14/082,004, 12 pgs.

Olson, Chris, Amendment After Allowance Pursaunt to 37 CFR 1.312 filed in the USPTO dated Jun. 7, 2016 for U.S. Appl. No. 14/081,678, 9 pgs.

Nguyen, Khanh V., Office Action received from the USPTO dated Jul. 14, 2016 for U.S. Appl. No. 15/132,083, 7 pgs.

\* cited by examiner

US 9,438,185 B2

DEVICES AND METHODS FOR INCREASING RELIABILITY OF SCALABLE PERIPHERY AMPLIFIERS

CROSS REFERENCE TO RELATED APPLICATIONS

The present application may be related to U.S. patent application Ser. No. 13/797,779 entitled "Scalable Periphery Tunable Matching Power Amplifier", filed on Mar. 12, 2013, whose disclosure is incorporated herein by reference in its entirety. The present application may also be related to International Application No. PCT/US2009/001358, entitled "Method and Apparatus for use in digitally tuning a capacitor in an integrated circuit device", filed on Mar. 2, 2009, the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety.

The present application may also be related to U.S. application Ser. No. 14/081,678 entitled "Methods and Devices for Testing Segmented Electronic Assemblies" filed on even date herewith and incorporated herein by reference in its entirety. The present application may also be related to U.S. application Ser. No. 14/082,004 entitled "Devices and Methods for Improving Yield of Scalable Periphery Amplifiers" filed on even date herewith and incorporated herein by reference in its entirety.

BACKGROUND

1. Field

The present application relates to power amplifiers.

2. Description of Related Art

In the field of mobile radios, a manufacturer can be dependent on the ability to quickly turn changes to power amplifiers (PA) or a Power Amplifier Module (PAM). These changes can be due to last minute changes in specification for the mobile radio to meet desired system specifications. This is a very difficult task for those PA's and PAM's dependent on silicon technologies due in part to long design cycle times and also long fabrication cycle times. These technologies include, but are not limited to, CMOS, SOI CMOS, SOS CMOS and BiCMOS.

SUMMARY

According to a first aspect of the present disclosure, an amplifier assembly is presented, the amplifier assembly comprising: a plurality of amplifier segments; and a controller configured to enable and/or disable one or more amplifier segments of the plurality of amplifier segments according to a set task, the set task determining a number of amplifier segments required to be enabled in a given time period According to a second aspect of the present disclosure, a method of increasing, reliability of as power amplifier is presented, the method comprising: providing the power amplifier with a plurality of amplifier segments, the plurality of amplifier segments adapted to be turned on or turned off, thus providing the amplifiers with a scalable configuration; establishing an application-dependent number of amplifier segments to be kept turned on during performance of an application, the application-dependent number of amplifier segments being inferior to the plurality of amplifier segments; establishing a timewise rotation sequence and a plurality of equal time intervals whereby the amplifier segments to be kept turned on are changed in rotation at the beginning of each time interval; and turning on and/or turning off the plurality of amplifier segments according to the established timewise rotation sequence and the equal time intervals.

According to a third aspect of the present disclosure, an assembly is presented, the assembly comprising: a plurality of amplifier segments comprising one or more amplifier segments in an enabled condition and one or more additional amplifier segments in a disabled condition, wherein the one or more amplifier segments in the enabled condition are adapted to be replaceable, upon failure, with the one or more amplifier segments in the disabled condition upon enabling the disabled additional one or more amplifier segments; a failure detector adapted to detect failure of each one of the amplifier segments; a controller configured to disable the one or more amplifier segments in the enabled condition, and configured to enable the one or more additional amplifier segments in the disabled condition upon indication of failure by the failure detector, of the one or more amplifier segments in the enabled condition.

According to a fourth aspect of the present disclosure a method of increasing reliability of a power amplifier is presented, the method comprising: fabricating the power amplifier as a plurality of amplifier segments, the plurality of amplifier segments adapted to be turned on or turned off; providing a failure detector adapted to detect failure of the amplifier segments; establishing a first subset of amplifier segments in an enabled condition and a second subset of amplifier segments in a disabled condition, the first subset of amplifier segments and the second subset of amplifier segments being interchangeable; monitoring the first subset of amplifier segments in the enabled condition with the failure detector; and turning off the first subset of amplifier segments from the enabled condition to a disabled condition and turning on the second subset of amplifier segments from the disabled condition to an enabled condition, by the controller, upon indication of malfunction by the failure detector, of the first subset of amplifier segments.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
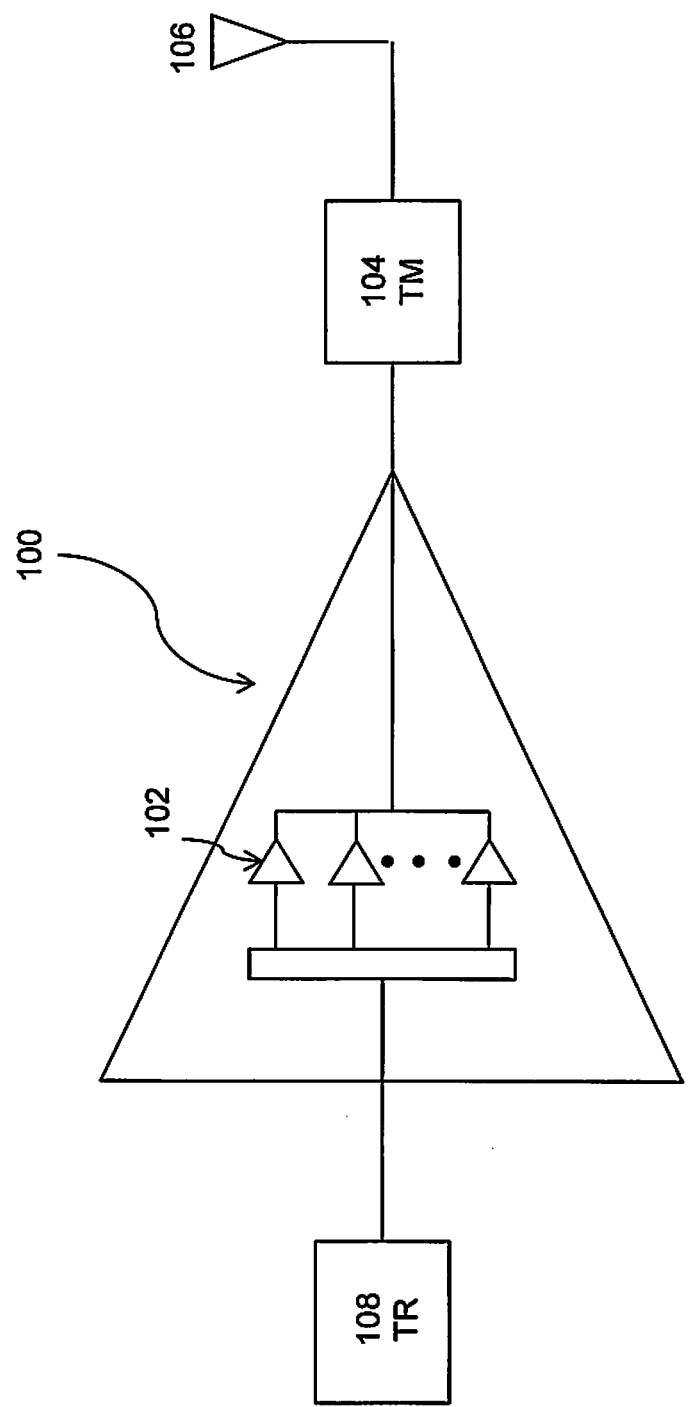
FIG. 1 shows and overview of an amplifier arrangement connected with a transmitter, a matching network and an antenna.

Integrated circuit designs are implemented with ever refining techniques and architectures. In some of these architectures, an electronic circuit comprises an assembly of parts, which can be denoted as segments. The purpose of such an implementation using segments can be varied. For example, digitally tunable capacitors are referred to, for example, in International Application No. PCT/US2009/001358, entitled "Method and Apparatus for use in digitally tuning a capacitor in an integrated circuit device", filed on Mar. 2, 2009, the disclosure of which is incorporated herein by reference in its entirety. Such capacitors comprise a number of segments. Another example (U.S. patent application Ser. No. 13/797,779) discloses power amplifiers comprising a number of amplifier segments. These examples are not meant as a limitation of the present disclosure, but serve to exemplify what is intended as an electronic assembly comprising a number of assembly segments. The present disclosure relates to methods for testing such electronic assemblies.

As used in the present disclosure, the terms "switch ON" and "activate" may be used interchangeably and can refer to making a particular circuit element electronically operational. As used in the present disclosure, the terms "switch OFF" and "deactivate" may be used interchangeably and can refer to making a particular circuit element electronically non-operational. As used in the present disclosure, the terms "amplifier" and "power amplifier" may be used interchangeably and can refer to a device that is configured to amplify a signal input to the device to produce an output signal of greater magnitude than the magnitude of the input signal.

The present disclosure describes electrical circuits in electronics devices (e.g., cell phones, radios) having a plurality of devices, such as for example, transistors (e.g., MOSFETs). Persons skilled in the art will appreciate that such electrical circuits comprising transistors can be arranged as amplifiers. As described in a previous disclosure (U.S. patent application Ser. No. 13/797,779), as plurality of such amplifiers can be arranged in a so-called "sealable periphery" (SP) architecture of amplifiers where a total number (e.g., (4) of amplifier segments are provided. Depending on the specific requirements of an application, the number of active devices (e.g., 64, 32, etc.) can be changed for each application. For example, in some instances, the electronic device may desire to output a certain amount of power, which in turn, may require 32 of 64 SP amplifier segments to be used. In yet another application of the electronic device, a lower amount of output power may be desired, in which case, for example, only 16 of 64 SP amplifier segments are used. In other words, in a given first time period, a first number of devices can be used, while in a subsequent time period, a different number of devices can be used based on desired output power.

The term "amplifier" as used herein the present disclosure is intended to refer to amplifiers comprising single or stacked transistors configured as amplifiers, and can be used interchangeably with the term "power amplifier (PA)". Stacked transistor amplifiers are described for example in U.S. Pat. No. 7,248,120, issued on Jul. 24, 2007, entitled "Stacked Transistor Method and Apparatus", the disclosure of which is incorporated herein by reference in its entirety. Such amplifier and power amplifiers can be applicable to amplifiers and power amplifiers of any stages (e.g., pre-driver, driver, final), known to those skilled in the art. The scalable periphery amplifier devices can be connected to corresponding impedance matching circuits. Such scalable periphery amplifier devices have a particular impedance value according to the number of amplifier segments that are turned on or turned off at a given moment, the modulation applied, the required output power, the linearity requirements of the amplifier or any number of other requirements.

As described above, an electronic circuit where all of the amplifiers of the scalable periphery architecture are turned on can be considered to be operating at full power, and such configuration can have a certain overall impedance based on the number of amplifiers that are turned on. In some instances, it can be desirable to turn of some amplifiers to operate the electronic circuit, for example, at reduced power consumption. Similar to measuring a total resistance of a plurality of resistors connected in parallel with each other, the total impedance of the plurality of amplifiers in a SP amplifier architecture can be calculated, simulated or measured in a similar manner. As known by those skilled in the art, the greater the number of amplifiers devices (in parallel), the lower the total impedance, and vice versa.

For determining the overall impedance of the plurality of amplifiers in an SP amplifier architecture, an amplifier that is off can be considered an open circuit (e.g., power amplifier device removed). Thus, if a certain number of amplifiers are turned off, then the total impedance of the SP amplifier will be higher. To the contrary, if the amplifier devices are on, then the total impedance of the amplifier circuit will be lower. As the amplifiers are turned on or turned off, the number of active amplifiers in the SP amplifier is decreased or increased, and therefore the overall impedance of the amplifier circuit is also changed.

As it is known by those skilled in the art, the performance of amplifiers (e.g., high power amplifiers made of MOSFETs) can degrade over time due to several degradation mechanisms. Such mechanisms may comprise, among others, electromigration (EM), time-dependent dielectric breakdown (TDDB), and hot carrier injection (HCI). Therefore, a lifetime is usually estimated for amplifiers (and other electronic components), indicating a time period over which the device is expected to be operational with significant statistical confidence. Another cause of variation in the performance of amplifiers is process variation. Due to a variety of causes, during fabrication an amplifier might have small variations in one or more of its operational parameters, which may vary, to a degree, within an expected range of values. In some cases, an amplifier may fall outside the specified range and therefore may need to be discarded. Similarly, during operation of an amplifier, its performance, before or after the expiration of the expected lifetime, may fall outside a specified range, and therefore may be deemed to have failed. Operation of an electronic device which comprises the amplifier may be adversely affected, up to the point of total failure for the electronic device.

The present disclosure describes structures and methods to improve overall reliability of electronic devices by improving reliability of amplifiers. By "reliability" it is intended that capacity of an amplifier to operate within an expected range of parameters, for example: at fabrication, after which the amplifier may be tested to verify its operation before sale or further fabrication steps; during operation, when an amplifier may be monitored and, if it is determined to have failed, deactivated; during operation, when an amplifier segment may be activated to replace as failed amplifier segment; during operation, when amplifier segments may be activated in a timewise rotation pattern to decrease the wear on individual amplifier segments, thereby increasing overall lifetime of an electronic device.

FIG. 1 shows a generic diagram of an example electronic circuit comprising an SP amplifier 100, which in turn, is comprised of a sealable periphery architecture 102 of amplifiers. An electronic circuit 108 can be connected to an input of the amplifier 100. In one embodiment, the electronic circuit may be a transmitter 108. The transmitter may be part of a transceiver. An output of the amplifier can be connected to a matching circuit 104, which can be connected to an antenna 106. In this embodiment, the antenna 106 would be a load, and a tunable matching component 104 is connected between the SP amplifier 100 and the antenna 106. The load impedance seen by the SP amplifier at its output is the sum of the impedance of the antenna 106 plus the impedance of the tunable matching circuit 104. A person skilled in the art will understand that the diagram shown in FIG. 1 is generic and that the electronic circuit can comprise more or less component such as, for example, a plurality of amplifiers (e.g., pre-driver stage, driver stage) or an antenna switch, which are not shown.

Figure 2:
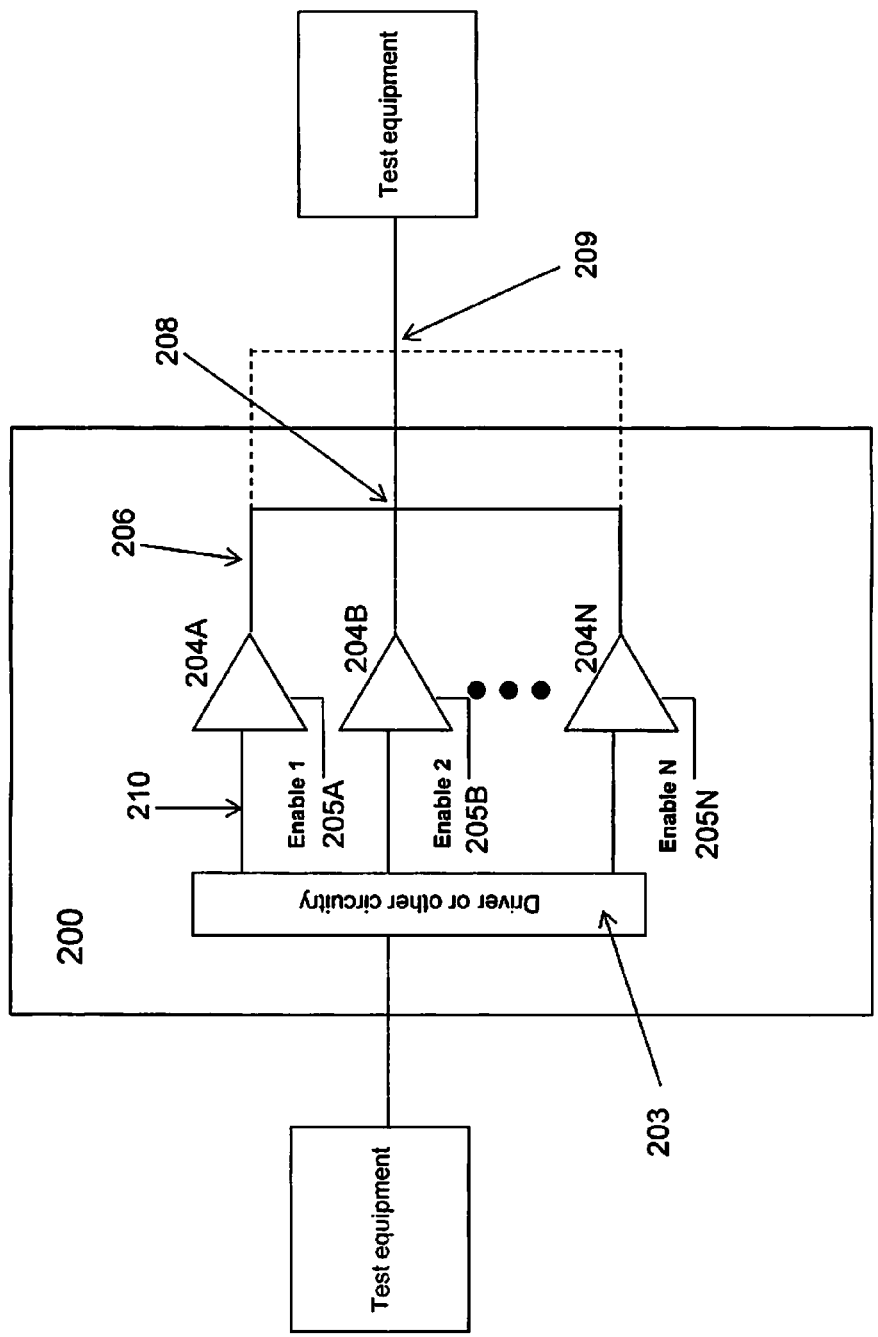
FIG. 2 shows an example scalable periphery arrangement on a die comprising N number of amplifier segments configured to be turned on and turned off according to various tasks and/or sequences.

According to some embodiments, amplifier segments can be part of an SP amplifier as shown in FIG. 2. FIG. 2 shows a die 200 (on wafer) comprising a plurality of amplifier segments 204A, 204B . . . 204N electrically connected in parallel with one another. Each of the amplifier segments 204A, 204B . . . 204N can be turned on or turned off independently of one another by a logic controller (shown later in FIGS. 4A-4B) that is connected to each of the enable inputs 205A, 205B . . . 205N on the amplifier segments. For example, the logic controller can send an independent disable signal to the enable input 205A in order to turn off amplifier segment 204A, and send an independent enable signal to the enable inputs 205B . . . 205N in order to turn on (or leave on) amplifier segments 204B . . . 204N. Such enable and/or disable signals can be independent of one another, such that the enable and/or disable signal applied to an enable input of a one amplifier segment is unrelated and/or unaffected by the enable and/or disable signal applied to the enable input of another amplifier segment. Since the amplifier segments 204A, 204B . . . 204N are connected in parallel with one another, as described above, similar to a plurality of resistors that are connected in parallel, the overall output impedance of the amplifier segments 204A, 204B . . . 204N is reduced as the number of active amplifier segments increase. On the other hand, the overall impedance of the amplifier segments increase as the number of amplifier segments 204A, 204B . . . 204N connected in parallel decrease. When the number of active amplifier segments is varied to optimize a desired parameter of the SP amplifier (as described in detail in the previous disclosure U.S. patent application Ser. No. 13/797,779), the impedance of the SP amplifier may decrease or increase.

Figure 3:
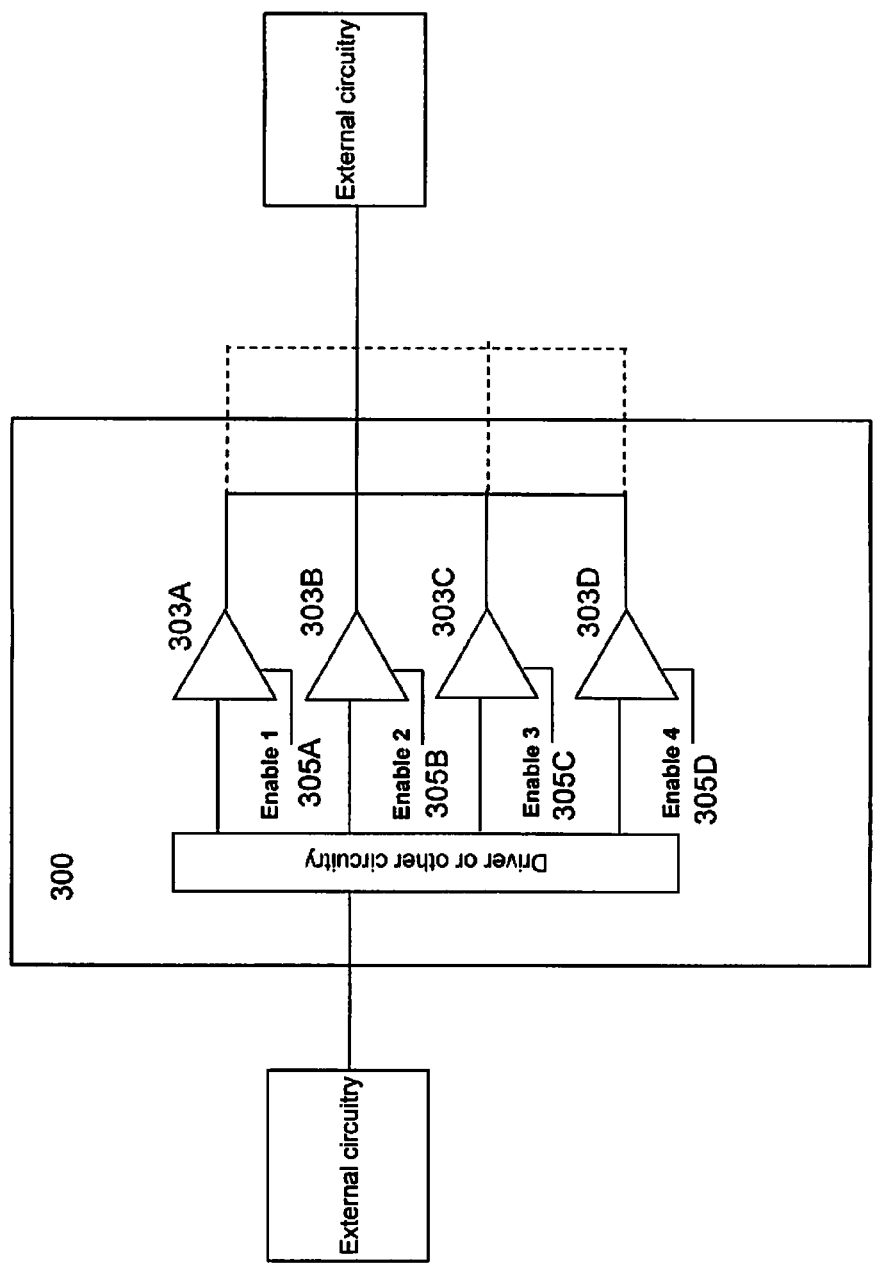
FIG. 3 shows an example scalable periphery arrangement on a die comprising four amplifier segments configured to be turned on and turned off according various tasks and/or sequences.

FIG. 3 shows an example scalable periphery amplifier that comprises four amplifier segments 303A, 303B, 303C, 303D for ease of explanation instead of the 64 amplifier segments as described above. The numbers four, or 64, refer to example embodiments and any number of amplifier segments may be used in the disclosure. In the example of FIG. 3, normal operation of the amplifier 300, which comprises a total of four amplifiers segments 303A, 303B, 303C, 303D, only requires two active segments, for example 303A and 303B. According to an embodiment of the present disclosure, in order to increase the lifetime of such amplifier assemblies, extra amplifier segments 303C, 303D in addition to the minimum required number of amplifier segments 303A, 303B can be built into the amplifier 300. In other words, more amplifier segments than required to perform the desired application can be incorporated into the amplifier 300. The additional amplifier segments 303C, 303D and the required amplifier segments 303A, 303B can be turned on or turned off according to tasks (e.g., applications) being performed by the device comprising the amplifier 300, thus the amplifiers have a scalable configuration where the various amplifier segments can be turned on and/or turned off. Further to the amplifier segments being turned on and/or turned off based on the task, the amplifier segments can also be turned on and/or turned off based on a set sequence and a set time interval, thus reducing the amount of time that each of the amplifier segments are turned on. Such rotational sequence (cycling) of the amplifier segments 303A-303D can reduce the degradation of the amplifier segments, which in turn, can extend the lifetime of the overall amplifier. For example, if it is desired to design an amplifier assembly that will last, for example, 10 years, but may be known by those skilled in the art that the amplifier segments comprising the amplifier may last only five years, then at least twice as many amplifier segments than initially required for the application can be used to build the amplifier. Hence, an application-dependent number of amplifier segments to be kept on during performance of the application can be selected.

FIG. 3 shows an example case when two amplifier segments 303A, 303B are required in order to perform the desired application, while instead four amplifier segments 303A-303D are incorporated into the amplifier configuration. A set sequence and a set time schedule can be selected to cycle the amplifier segments 303A-303D. For example, during a first period of operation, amplifier segments 303A and 303B can be turned on, while amplifier segments 303C and 303D are turned off. During a second period of operation, amplifier segments 303B and 303C can be turned on, while amplifier segment 303A and amplifier segment 303D are turned off. During a third period of operation, amplifier segments 303C and 303D can be turned on, while amplifier segments 303A and 303B are turned off. During a fourth period of operation, amplifier segments 303A and 303D can be turned on, while amplifier segments 303B and 303C are turned off. By cycling the amplifier segments 303A-303D according to the sequence described above, the number of amplifier segments that are turned on during each time period is constant. A person skilled in the art would appreciate that variations of such cycle can be used based on the task that is performed with the amplifiers. Such sequence can be cycled at set time intervals, for example, every day, hour, minute, second, millisecond, or every GSM slot (e.g., 20 millisecond interval between transmission bursts), which can be set by according, to the application for which the amplifier was designed. According to the configuration and sequence described above, the amplifier can last twice as long by including four amplifier segments into the amplifier assembly instead of including just two amplifier segments (e.g., the minimum required number of amplifiers for the desired application). Since two of the four amplifier segments are turned off during each period of operation, the degradation of the two "off" amplifier segments is reduced or halted, thus increasing the overall lifetime of the amplifier.

In some embodiments, the amplifier can comprise a logic controller (shown later in FIGS. 4A-4B) that can be configured to turn on and turn off the plurality of amplifier segments 303A-303D according to the set sequence and time interval. The logic controller can send an independently controllable enable or a disable signal to the enable inputs 305A-305D in order to turn on or turn off the amplifier segments 303A-303D, respectively. By way of example and not of limitation, in order to cycle the amplifier segments 303A-303D as described above, the logic controller can be configured to send an enable signal to the enable inputs 303A and 303B during the first period of operation, while a disable signal is sent to the enable inputs 303C and 303D. Accordingly, the logic controller can be programmed to send various combinations of enable and/or disables signals to the enable inputs 305A-305D of amplifiers 303A-303D according to a selected algorithm for cycling the amplifier segment.

Figures 4A, 4B:
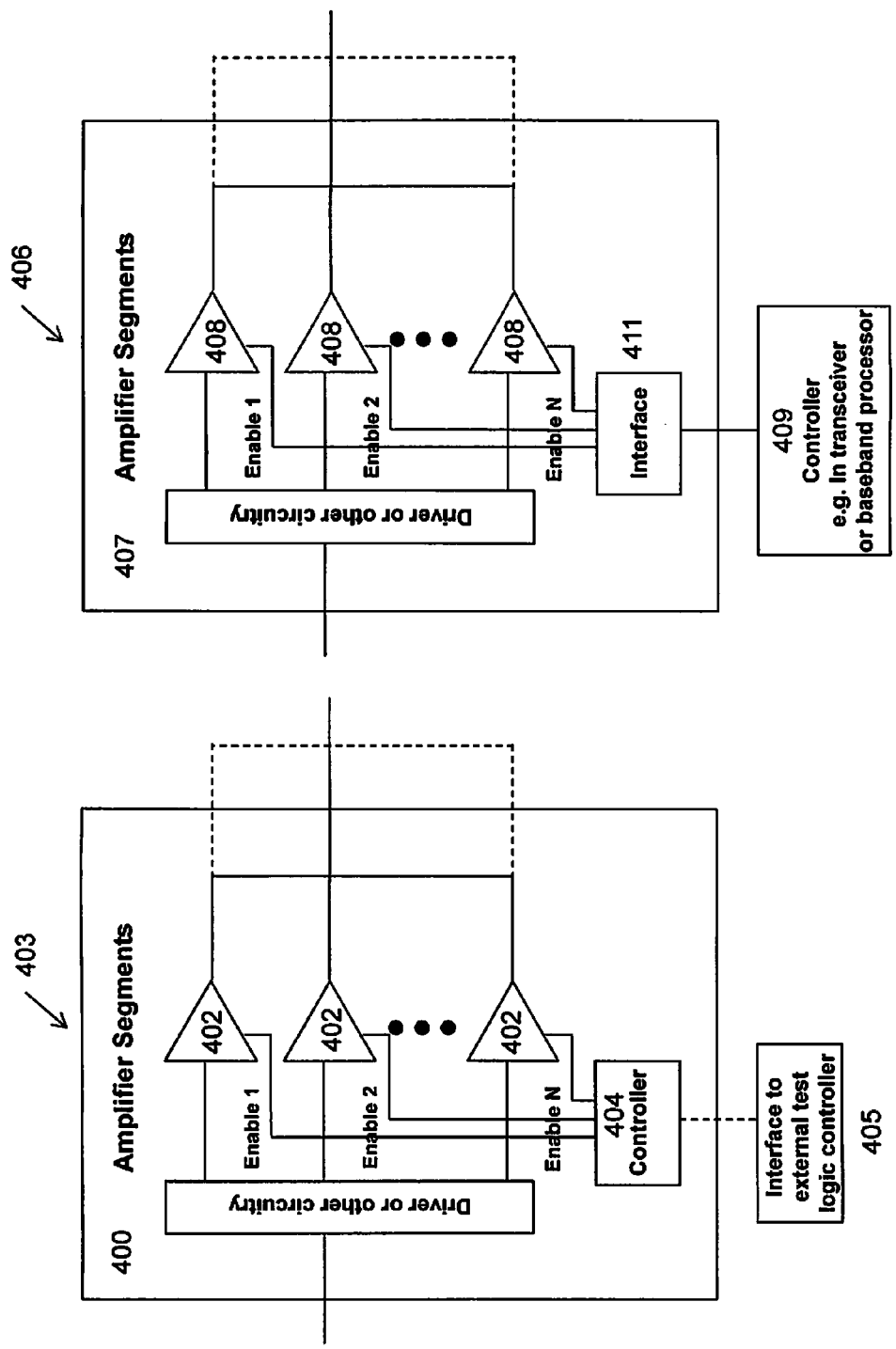
FIGS. 4A-4B show example scalable periphery arrangements on a die with a logic controller located on the die (FIG. 4A) or separate from the die (FIG. 4B).

FIGS. 4A-4B show example implementations of the logic, controller 405, 409 for the amplifiers according to the embodiments of the present disclosure. FIG. 4A shows an SP amplifier 403 (alternatively denoted as simply an 'amplifier', as opposed to its 'amplifier segments'), of said SP amplifier comprising a plurality of amplifier segments 402 on a die 400, with a logic controller 404 located on the die 400. In such configuration, an external testing logic controller 405 can be connected to the internal logic controller 404 in order for the amplifier 406 to perform test procedures by turning on and/or turning off the amplifier segments as described earlier according to various embodiments of the present disclosure. FIG. 4B shows an amplifier 406 similar to the amplifier 403 shown in FIG. 4A, also comprising a plurality of amplifier segments 408 on a die 407. Differently from the amplifier 403 in FIG. 4A, the amplifier 406 in FIG. 4B comprises a logic controller 409 located externally to the die 407, through an interface 411. By way of example and not of limitation, such logic controller 409 can be located in a transceiver (similarly to 108 in FIG. 1) or in a baseband processor such that during operation of the amplifier 406, the control signals are provided from the transceiver or the baseband processor. On the other hand, when in the test mode, the external controller 409 can be provided, for example, by a test equipment to turn on and/or turn off the amplifier segments 408 to perform the test procedures according, for example, to the embodiment of FIG. 3. Similarly, the controller 409 in FIG. 4B may comprise different external logic controllers.

Examples of different functions implemented by a controller (such as 409 in FIG. 4B) comprise, by way of examples and not of limitation, timewise selection of different amplifier segments to spread 'wear and tear' of the amplifier segments, and deactivation of faulty amplifier segments, which may be accompanied by a corresponding activation of 'spare' amplifier segments which were inactive at the time a partial failure occurred in the SP amplifier. As those skilled in the art will understand, such exemplificatory implementation may be realized, in some embodiments, by fabricating the SP amplifier with a higher number of amplifier segments than needed by basic operation of the SP amplifier. For example, if the SP amplifier can normally be operated with 64 amplifier segments with an average lifetime for the SP amplifier of 5 years, it may alternatively be built with 128 amplifier segments which are operated on a time rotation, thereby increasing the overall lifetime for the SP amplifier to 10 years. The amplifier segments may be rotated on any timescale, depending on the desired implementation, for example the segments may be rotated every few milliseconds, or every year. Such examples are not intended as a limitation. In fact, the mode of failure may be non linear with active operational time; for example, after a certain usage period a heat build-up might increase the amplifier segment degradation. In such cases, a time rotation designed to turn of an amplifier segment before it reaches a point of heat build-up, and substituting it with a newly activated amplifier segment, might even increase the overall lifetime of the SP amplifier by more than twice a value compared to an SP amplifier with only as many amplifier segment as needed by normal operation.

In one embodiment of a segmented amplifier architecture (scalable periphery), extra amplifier segments are built into the SP amplifier. For example, referring to FIG. 4A, the amplifier segments 402 may include a total number of N amplifier segments. At peak required output, segments from 1 to N/2 may be activated while the remaining segments, those from (N+1)/2 to N, may be deactivated. During normal operation of the amplifier, by way of example and not of limitation, only a maximum of N/2 amplifier segments may be needed for optimal operation. After a specified time, the controller 404 will deactivate all segments from 1 to N/2 and utilize instead those front N/2 to N, thereby distributing the wear and tear across multiple segment amplifiers.

In another embodiment, a different fraction of inactive amplifier segments may be provided. For example, if the total number of amplifier segments is N, the maximum number of simultaneously active segment amplifiers might be N/3. The remaining 2N/3 amplifier segments might be kept as spare, or activated at different times to spread wear, or a combination of two. Other purposes might be possible for the surplus amplifier segments. Any fraction of inactive to total amplifier segments may be used in the present disclosure.

Figure 5A:
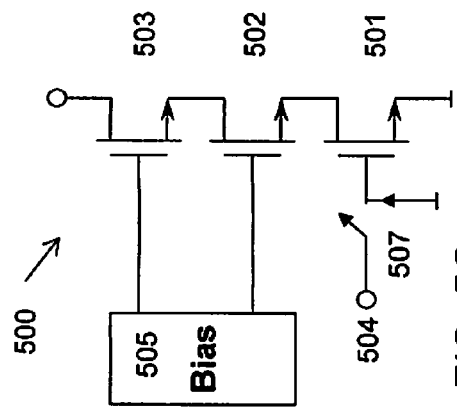
FIGS. 5A-5D show example implementations of enabling and/or disabling stacked transistors in an amplifier segment of the amplifier arrangement.
Figure 5C:
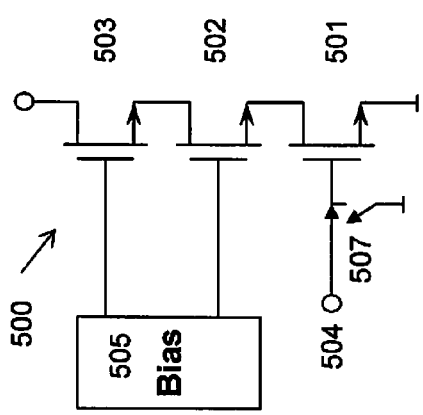
Figure 5B:
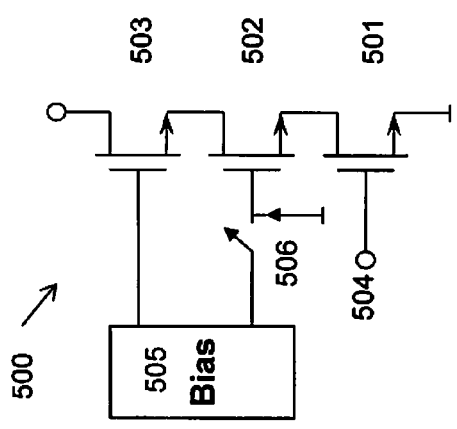

FIGS. 5A-5D show example implementations for enabling and/or disabling each of the amplifier segments. A single amplifier segment 500 (e.g., 303A from FIG. 3) can comprise, for example, stacked transistors 501, 502, 503, where a DC bias voltage is applied to the top two transistors 502, 503. The gate 504 of the bottom transistor 501 can be adapted to receive an input RF signal to be amplified by the amplifier segment 500. The middle transistor 502 can comprise a switch 506 that can ground the gate of transistor 502 when the logic controller (405 or 409 from FIGS. 4A-4B) sends a disable (turn off) signal to the amplifier segment 500. When the logic controller sends an enable (turn on) signal to the amplifier segment 500, then the switch 506 can unground the gate of transistor 502 and complete the electrical path of the DC bias between the DC power supply 505 and the gate of transistor 502. Accordingly, FIG. 5A shows the amplifier segment 500 in the disabled (turned off) configuration and FIG. 5B shows the amplifier segment 500 in the enabled (turned on) configuration.

Figure 5D:
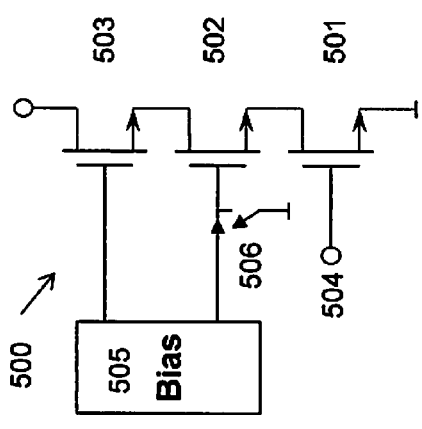

Alternatively, FIGS. 5C-5D show similar configurations as in FIGS. 5A-5B, except that switch 507 is located at the gate of the bottom transistor 501 by interrupting the RF input signal and ground the gate of transistor 501 when the logic controller sends a disable (turn off) signal to the amplifier segment 500. Accordingly, FIG. 5C shows the amplifier segment 500 in the disabled (turned off) configuration and FIG. 5D shows the amplifier segment 500 in the enabled (turned on) configuration. Disabling the lowermost transistor 501 of the stacked transistors 501, 502, 503 allows for a more distributed voltage division of the power supply voltage (e.g., $V_{dd}$) when the stacked transistors are turned off, thus reducing the amount of stress that would be placed on a single transistor if the entire supply voltage was dropped over just a single transistor (for example, see U.S. Pat. No. 7,248,120, whose disclosure is incorporated herein by reference in its entirety).

Figure 6:
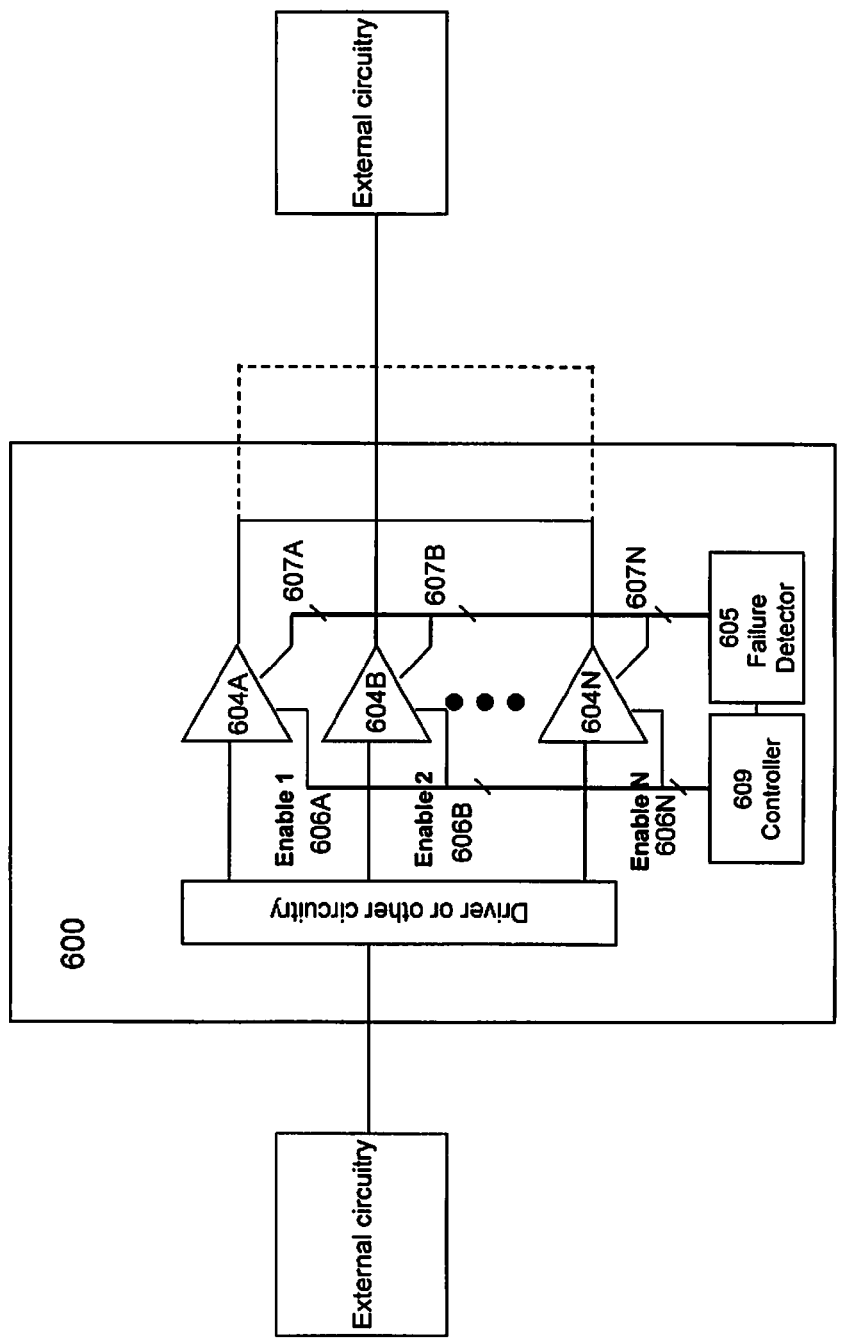
FIG. 6 shows an example scalable periphery arrangement on a die comprising a plurality of amplifier segments with spare disabled amplifier segments configured to be enabled when the enabled amplifier segments fail.

According to another embodiment of the present disclosure as shown in FIG. 6, the amplifier assembly on a die 600 can comprise a desired number of amplifier segments 604A, 604B . . . 604N, based on the application for which the amplifier assembly is designed. The normal operation of the amplifier assembly may require a maximum of N/2 segments to be operational at the same time, therefore it may comprise N/2 extra amplifier segments which can be used interchangeably with the minimum required amplifier segments to improve overall reliability (e.g., to increase overall lifetime, or to recover front partial failure of the assembly). The amplifier assembly may comprise a failure detector 605 (shown in detail in FIG. 7) on the die 600 to sense when any of the amplifier segments fails or malfunctions by monitoring, for example, quiescent current, RF current, RF output power, and/or output voltage waveforms. Other parameters may be monitored which may be relevant to a malfunction. The failure detector 605 can then inform a logic controller 609 of the failed or malfunctioned amplifier segments and the logic controller 609 can decide which of the additional amplifier segments should be turned on and enabled to replace the failed amplifier segments. As described earlier, such logic controller 609 can be located either on the same die 600 as the amplifier segments or can be located on devices external to the amplifier segments such as, for example, to transceiver or a baseband processor.

According to an embodiment of the present disclosure, the failure detector 605 can be connected to the amplifier segments 604A, 604B . . . 604N via failure outputs 607A, 607B, . . . 607N to sense failure or malfunction of the amplifier segments, and the logic controller 605 can be connected to enable inputs 606A, 606B . . . 606N to turn on or turn off the amplifier segments according to instructions received from the failure detector 605. Therefore, when the failure detector 605 senses an indication of failure or malfunction of an amplifier segment, the failure detector 605 will indicate the logic controller 609 to send a disable signal to the failed amplifier segment and send an enable signal to the alternate amplifier segment that is to be turned on to replace the failed amplifier segment.

Figure 7:
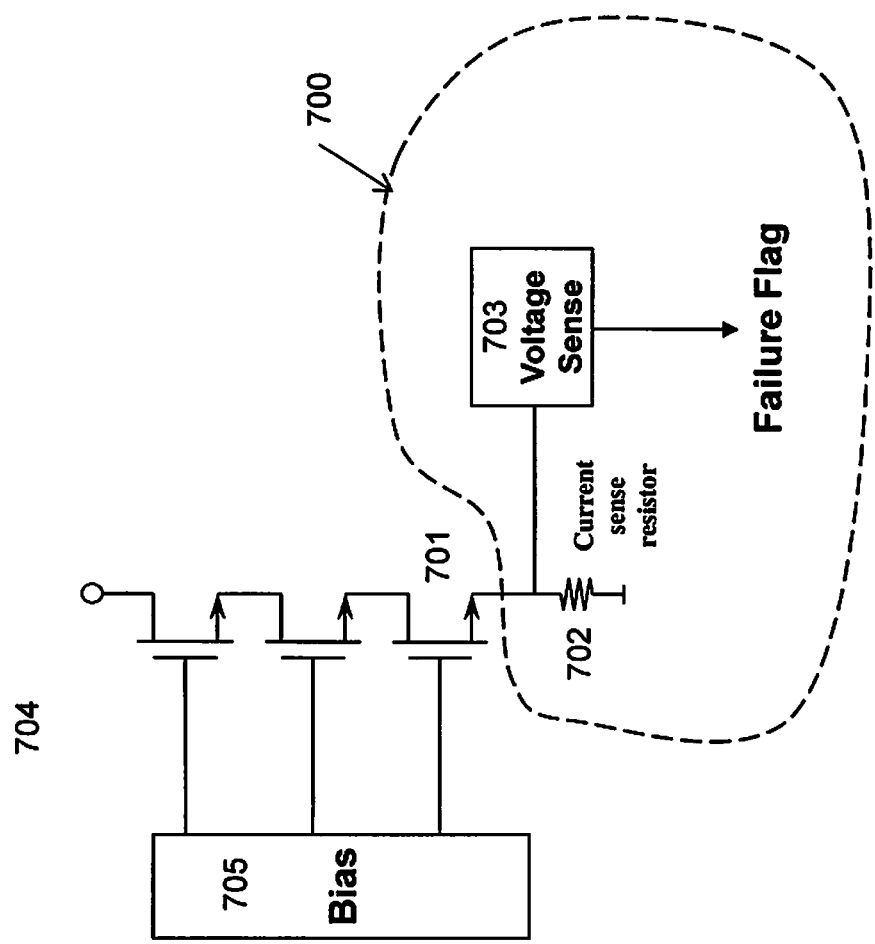
FIG. 7 shows an example failure detector of the amplifier segments as described in some embodiments of the present disclosure.

In one embodiment, a quiescent current parameter, as described above, may be monitored by a failure detector (such as 605 in FIG. 6). As it is known by those skilled in the art, the quiescent current is the current of an amplifier not under load. FIG. 7 shows an example circuital arrangement of a quiescent current sensing failure detector 700 for an amplifier segment 704. The quiescent current sensing failure detector 700 can comprise a current sensing resistor 702 connected at the source of a bottom stacked transistor 701 (e.g., connected between the source and ground) with a voltage sensor 703 configured to measure the voltage of the current sensing resistor 702. The voltage sensor 703 can be set so that it monitors a specific voltage that is expected when the transistor is functioning properly, when under bias but not under load. If a voltage is measured that is higher or lower than the expected voltage by the voltage sensor 703, then the voltage sensor 703 will trigger a failure flag. In some embodiments, the failure flag can be sent to a logic controller (such as 609 in FIG. 6, and the logic controller can take appropriate action to disable the failed amplifier segment and enable one of the spare amplifier segments.

Those skilled in the art will understand that FIG. 7 depicts a possible embodiment of a failure detector, but several variations, or entirely different designs, might be implemented. For example, a switch might be present between bias 705 and transistor 701, in such a way as to enable transistor 701 to be connected either to bias 705 or to another signal (e.g., an RF signal).

According to an example configuration, if the amplifier requires two amplifier segments to meet the minimum number of required amplifier segments for the specific application, then the two required amplifier segments can be initially enabled, and the two extra amplifier segments can be initially disabled. The failure detector can continuously monitor the enabled amplifier segments for proper operation. If the failure detector senses that one or more of the enabled amplifier segments has failed (e.g., operating outside of specifications), then the logic controller can disable the failed amplifier segments and enable the extra amplifier segments that were initially disabled. Although the present example describes a configuration comprising an equal number of required amplifier segments and extra amplifier segments, those skilled in the art would understand that there can be more or less extra amplifier segments than the required amplifier segments depending on the level of reliability desired with the amplifiers.

The examples set forth above are provided to give those of ordinary skill in the art a complete disclosure and description of how to make and use the embodiments of the present disclosure, and are not intended to limit the scope of what the inventors regard as their disclosure. Modifications of the above described modes for carrying out the disclosure may be used by persons of skill in the art, and are intended to be within the scope of the following claims. All patents and publications mentioned in the specification may be indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

The invention claimed is:

1. A method of increasing reliability of a power amplifier, the method comprising:
   establishing a set of operating characteristics of the power amplifier;
   based on the set of operating characteristics, establishing a minimum number of amplifier segments to enable the set of operating characteristics;
   providing the power amplifier with a plurality of amplifier segments comprising a total number of amplifier segments in excess of the minimum number, the plurality of amplifier segments adapted to be turned on or turned off, thus providing the power amplifier with a scalable configuration;

establishing an application-dependent number of amplifier segments to be kept turned on during performance of an application, the application-dependent number of amplifier segments being inferior to the plurality of amplifier segments, wherein during performance of the application, the power amplifier operates within the set of operating characteristics;

establishing a timewise rotation sequence and a plurality of equal time intervals whereby the amplifier segments to be kept turned on are changed in rotation at the beginning of each time interval; and turning on and/or turning off the plurality of amplifier segments according to the established timewise rotation sequence and the equal time intervals.

2. The method according to claim 1, wherein the turning on and/or turning off is performed by a controller.

3. The method according to claim 2, wherein the controller is a logic controller programmed with logic instructions according to the established timewise rotation sequence and the equal time intervals.

4. The method according to claim 1, wherein the timewise rotation sequence reduces a duty cycle of each of the plurality of amplifier segments, thus increasing an overall lifetime of the power amplifier.

5. The method of claim 1, wherein providing the power amplifier with the plurality of amplifier segments comprising a total number of amplifier segments in excess of the minimum number is based on a desired operating lifetime of the power amplifier.

6. An assembly comprising:
a plurality of amplifier segments comprising one or more amplifier segments in an enabled condition and one or more additional amplifier segments in a disabled condition, wherein the one or more amplifier segments in the enabled condition are adapted to be replaceable, upon failure, with the one or more amplifier segments in the disabled condition upon enabling the disabled additional one or more amplifier segments;
a failure detector adapted to detect failure of each one of the amplifier segments;
a controller configured to disable the one or more amplifier segments in the enabled condition, and configured to enable the one or more additional amplifier segments in the disabled condition upon indication of failure by the failure detector, of the one or more amplifier segments in the enabled condition.

7. The assembly according to claim 6, wherein a fraction of a total number of the plurality of amplifier segments are amplifier segments in an enabled condition and a remainder of the total number of the plurality of amplifier segments are amplifier segments in a disabled condition.

8. The assembly according to claim 7, wherein the fraction is one half of the total number of the plurality of amplifier segments.

9. The assembly according to claim 6, wherein the controller is a logic controller.

10. The assembly according to claim 6, wherein the failure detector and the controller are located on a same die.

11. The assembly according to claim 6, wherein the failure detector and the controller are located on different dies.

12. The assembly according to claim 6, wherein the failure detector is a quiescent current detector.

13. A method of increasing reliability of a power amplifier comprising:
fabricating the power amplifier as a plurality of amplifier segments, the plurality of amplifier segments adapted to be turned on or turned off;
providing a failure detector adapted to detect failure of the amplifier segments;
establishing a first subset of amplifier segments in an enabled condition and a second subset of amplifier segments in a disabled condition, the first subset of amplifier segments and the second subset of amplifier segments being interchangeable;
monitoring the first subset of amplifier segments in the enabled condition with the failure detector; and
turning off the first subset of amplifier segments from the enabled condition to a disabled condition and turning on the second subset of amplifier segments from the disabled condition to an enabled condition, by a controller, upon indication of malfunction by the failure detector, of the first subset of amplifier segments.

14. The method according to claim 13, wherein the disabling of the first subset of amplifiers and the enabling of the second subset of amplifiers is performed automatically by the controller.

15. The method according to claim 13, wherein the turning off the first subset of amplifier segments from the enabled condition to a disabled condition and turning on the second subset of amplifier segments from the disabled condition to an enabled condition is performed simultaneously.

16. The method according to claim 13, wherein the turning off the first subset of amplifier segments from the enabled condition to a disabled condition and turning on the second subset of amplifier segments from the disabled condition to an enabled condition is performed between transmission bursts.

17. The method according to claim 13, wherein the failure detector monitors quiescent current of the amplifier segment.

* * * * *